United States Patent
Janssen et al.

(10) Patent No.: US 12,074,007 B2
(45) Date of Patent: Aug. 27, 2024

(54) ROTATING SAMPLE HOLDER FOR RANDOM ANGLE SAMPLING IN TOMOGRAPHY

(71) Applicant: FEI Company, Hillsboro, OR (US)

(72) Inventors: Bart Jozef Janssen, Eindhoven (NL); Edwin Verschueren, Mierlo (NL); Erik Franken, Nuenen (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 18/357,904

(22) Filed: Jul. 24, 2023

(65) Prior Publication Data

US 2023/0377835 A1    Nov. 23, 2023

Related U.S. Application Data

(63) Continuation of application No. 17/649,917, filed on Feb. 3, 2022, now Pat. No. 11,756,762, which is a continuation of application No. 16/843,770, filed on Apr. 8, 2020, now Pat. No. 11,257,656.

(51) Int. Cl.
*H01J 37/20* (2006.01)

(52) U.S. Cl.
CPC ..... *H01J 37/20* (2013.01); *H01J 2237/20214* (2013.01); *H01J 2237/226* (2013.01)

(58) Field of Classification Search
CPC ................. H01J 37/20; H01J 2237/226; H01J 2237/20214
See application file for complete search history.

(56) References Cited

U.S. PATENT DOCUMENTS

| | | | | |
|---|---|---|---|---|
| 5,075,623 A * | 12/1991 | Matsuda | ............ | G01R 33/0213 324/250 |
| 5,528,655 A | 6/1996 | Umetani et al. | | |
| 5,646,403 A * | 7/1997 | Mori | ....................... | H01J 37/20 250/442.11 |
| 5,744,800 A * | 4/1998 | Kakibayashi | ........... | H01J 37/26 250/311 |
| 6,855,929 B2 * | 2/2005 | Kimba | ................... | H01J 37/073 250/307 |
| 7,223,973 B2 * | 5/2007 | Kimba | ............... | G01N 23/2251 250/307 |

(Continued)

FOREIGN PATENT DOCUMENTS

| | | |
|---|---|---|
| CN | 106783496 B | 5/2018 |
| JP | H04-372887 A | 12/1992 |

OTHER PUBLICATIONS

Extended European Search Report from European Application No. 21166728.2, dated Aug. 13, 2021, 8 pages.

(Continued)

*Primary Examiner* — David A Vanore
(74) *Attorney, Agent, or Firm* — Klarquist Sparkman, LLP

(57) ABSTRACT

A sample holder retains a sample and can continuously rotate the sample in a single direction while the sample is exposed to a charged particle beam (CPB) or other radiation source. Typically, the CPB is strobed to produce a series of CPB images at random or arbitrary angles of rotation. The sample holder can rotate more than one complete revolution of the sample. The CPB images are used in tomographic reconstruction, and in some cases, relative rotation angles are used in the reconstruction, without input of an absolute rotation angle.

15 Claims, 7 Drawing Sheets

(56) References Cited

U.S. PATENT DOCUMENTS

| | | | |
|---|---|---|---|
| 8,822,919 B2* | 9/2014 | Kimba | H01J 37/073 |
| | | | 250/307 |
| 9,147,551 B2 | 9/2015 | Luecken et al. | |
| 9,773,640 B2 | 9/2017 | Shimakura et al. | |
| 10,132,761 B2 | 11/2018 | Aoyama | |
| 10,134,564 B2 | 11/2018 | Okumura et al. | |
| 11,257,656 B2* | 2/2022 | Janssen | H01J 37/20 |
| 11,756,762 B2* | 9/2023 | Janssen | H01J 37/26 |
| | | | 250/307 |
| 2002/0033449 A1* | 3/2002 | Nakasuji | H01J 37/05 |
| | | | 250/306 |
| 2002/0036264 A1* | 3/2002 | Nakasuji | H01J 37/185 |
| | | | 250/306 |
| 2005/0121611 A1* | 6/2005 | Kimba | H01J 37/073 |
| | | | 250/311 |
| 2009/0116363 A1 | 5/2009 | Watanabe et al. | |
| 2014/0367570 A1* | 12/2014 | Kimba | H01J 37/244 |
| | | | 250/307 |
| 2017/0330724 A1 | 11/2017 | Okumura et al. | |

OTHER PUBLICATIONS

Hagen et al., "Implementation of a cryo-electron tomography tilt-scheme optimized for high resolution subtomogram averaging," *Journal of Structural Biology*, 197:191-198 (2017).

"Stroboscopic Continuous Tilt Tomography in a Transmission Electron Microscope," Research Disclosure, available at: www.researchdisclosure.com, 3 pages (Oct. 2017).

Zang et al., "Space-Time Tomography for Continuously Deforming Objects," ACM Transactions on Graphics, 37:100:1-100:14 (Aug. 2018).

Communication pursuant to Article 94(3) EPC from European Application No. 21166728.2-1001, dated Oct. 30, 2023, 5 pages.

\* cited by examiner

ROTATING SAMPLE HOLDER FOR RANDOM ANGLE SAMPLING IN TOMOGRAPHY

CROSS REFERENCE TO RELATED APPLICATION

This application is a continuation U.S. patent application Ser. No. 17/649,917, filed Feb. 3, 2022, which is a continuation of U.S. patent application Ser. No. 16/843,770, filed Apr. 8, 2020, now U.S. Pat. No. 11,257,656, all of which are incorporated herein by reference in their entireties.

FIELD

The disclosure pertains to electron tomography.

BACKGROUND

Tomographic imaging electron microscopy is based on acquisition of sample images at a plurality of angles of exposure. These angles are typically set by stepping the sample through series of ascending angles. In other examples, the angles are set by tilting the sample back and forth. One difficulty with these conventional approaches is the limited range of tilt angles available in conventional electron microscopes. In addition, it can be difficult to precisely set angles, particularly in back-and-forth tilt protocols in view of the successive large angular movements and angular direction changes. Back and forth tilting can also be time consuming due to the multiple starts and stops required. Furthermore, conventional ascending angular sampling schemes are not optimal for radiation sensitive samples, where it can be beneficial to first sample the angles for which the sample is tilted minimally. For these and other reasons, alternative approaches are needed.

SUMMARY

Random angle sampling in tomographic acquisition as disclosed herein can be beneficial for reconstruction quality and can enable reconstruction of dynamically deforming samples. In typical examples disclosed herein, stroboscopic charged particle beam (CPB) exposures of a rotating sample holder permit random angle sampling in tomographic acquisitions. The sample can be rotated at a constant or variable angular velocity and sample angles can be chosen by selection of exposure times. As used herein, exposure durations are generally selected so that sample rotation during exposure does not produce unacceptable image blur, and such exposures are referred to herein as "stroboscopic" exposures.

Representative methods comprise rotating a sample in one direction, the rotation being continuous, wherein the sample rotates through multiple revolutions, and wherein all angles of a complete revolution of the sample are available. The sample is illuminated with a plurality of electron beam pulses at a pulse rate and while the sample is rotating. Alternatively, the sample can be irradiated with X-rays. In response to the illuminating, a plurality of images of the sample is acquired, each image acquired with the sample at a different relative angle to at least one of the other acquired images and the relative angle of the sample in each acquired image is determined. In some examples, determining the relative angle of the sample is performed in concert with the respective acquiring of the image or after the respective acquiring of the image. In some embodiments, an absolute angle of the sample in each acquired image is determined based on or during a tomographic reconstruction of the sample. As used herein, an absolute angle is an orientation angle of the sample with respect to a fixed reference. In some examples, determining the relative angle of the sample in each acquired image includes reading an encoder coupled to a rotatable sample holder at the time of acquisition, the rotatable sample holder rotating the sample. As used herein, a relative angle between a first projection image acquired at a first angle and a second projection image acquired at a second angle is defined as a rotation needed to apply to the sample to move the sample from the first projection angle (i.e., the first projection direction) to the second projection angle (i.e., to the second projection direction). In representative examples, the determining of the absolute angle of the sample in each acquired image is based on a reading of the encoder. In other examples, the determining the relative angle of the sample in each acquired image includes determining the relative angle based on a reconstruction of the sample or based on rotation time. The pulse rate can be variable, such as varied per revolution or after multiple revolutions of the sample, or the pulse rate can be changed after each full rotation of the sample. In some examples, the pulse rate is increased or decreased after each full rotation of the sample, and the rotation is at a constant or variable velocity.

Representative apparatus comprise a rotatable sample holder operable to rotate a sample continuously in one direction through multiple revolutions, and wherein all angles of a complete revolution of the sample are available. An electron beam source is operable to irradiate the sample with a plurality of electron beam pulses at a pulse rate and while the sample is rotating. A detection system operable to acquire a plurality of images of the sample corresponding to the plurality of electron beam pulses. The detection system can include an electron detector situated to receive electron pulse portions responsive to the electron beam irradiation of the sample, and wherein each image is acquired with the sample at a different relative angle to at least one of the other acquired images. In some embodiments, a controller is configured to determine the relative angle or an absolute angle of the sample in each acquired image. In some examples, an encoder is coupled to the rotatable sample holder at the time of image acquisition. According to representative examples, the pulse rate of the electron beam source is variable using random intervals, non-constant intervals, or Poisson-distributed intervals and the electron beam source can be operable to produce electron beam pulses at a pulse rate that is changed after each full rotation of the sample.

At least one computer readable medium containing processor-executable instructions is configured to control an electron beam system to rotate a rotatable sample holder continuously in one direction through multiple revolutions, and wherein all angles of a complete revolution of a sample situated on the rotatable sample holder are available. While the sample is rotating, the sample can be irradiated with an electron beam source with a plurality of electron beam pulses at a pulse rate. A plurality of images of the sample is acquired corresponding to each of the plurality of electron beam pulse, and a reconstruction of the sample based on the acquired plurality of images.

In some examples, methods include unidirectionally rotating a sample through an angular range that includes at least one full rotation revolution. During the unidirectional rotation, the rotating sample is stroboscopically irradiated at a plurality of angles and sample images are acquired at each of the corresponding plurality of angles. In some cases, a tomographic image of the sample is produced based on the sample images. According to some examples, relative rotation angles or absolute rotation angles associated with the sample images are determined before, after, or during acquisition of the sample images. In some cases, the relative angles of the sample and/or the absolute angles of the sample associated with the sample images are determined based on a tomographic reconstruction. In further embodiments, the sample is secured to a rotatable sample holder and relative rotation angles and/or absolute rotation angles are determined with an encoder coupled to the rotatable sample holder. In some examples, the rotating sample is stroboscopically irradiated at a fixed pulse rate or at a variable pulse rate to produce pulses at fixed or variable time intervals. Variable pulse intervals can be produced with stepped or chirped pulse rates. Alternatively, random time intervals can be used, for example, time intervals specified by an exponential distribution or other distribution. As used herein, "pulse rate" refers to a number of pulses per unit time and can be fixed, stepped, chirped or otherwise a deterministic or probabilistic function of time. For example, a pulse rate can be chirped at a fixed or variable rate, or a pulse chirp rate can be randomly selected. In some examples pulses are applied at intervals that are random as specified with, for example, a probability distribution such as the Poisson distribution, an exponential distribution, or other distribution. Some of these distributions are characterized with parameters that are referred to as rate parameters, but these rate parameters do not necessarily correspond to actual pulse rates (pulses/time) although such actual pulse rates and average pulse rates can be determined with a distribution. Rate parameters or other parameters that specify distributions can be fixed, but can be variable as well. For example, for pulse rates or pulse intervals (x) specified by an exponential distribution $f(x; \lambda) = \lambda e^{-\lambda x}$, wherein $\lambda$ is rate parameter, this rate parameter can be a function of time as well, i.e., $\lambda = \lambda(t)$. In further examples, the stroboscopic exposures of the rotating sample are at a variable pulse rate that is determined based on an angle or number of rotations of the rotating sample. According to representative examples, the sample is unidirectionally rotated through an angular range that includes a plurality of full rotations.

Representative apparatus include a switchable charged particle beam (CPB) source and a rotatable sample stage operable to rotate a sample by at least one complete revolution. A controller is coupled to the CPB source and the rotatable sample stage and configured to expose a sample situated on the rotatable sample stage at a plurality of angles during a unidirectional rotation of the sample, wherein the plurality of exposure angles are in a range greater than 360°. In some examples, the controller is coupled to activate the CPB source at the plurality of angles during the unidirectional rotation of the sample to stroboscopically expose the sample to the CPB. In other examples, controller is coupled to blank the CPB so that the sample is stroboscopically exposed to the CPB at the plurality of angles during the unidirectional rotation of the sample. According to some embodiments, a rotational encoder is coupled to the rotatable sample stage and provides at least one of a relative rotation angle and an absolute rotation angle for each of the exposure angles. In some examples, the controller establishes the stroboscopic exposures at a fixed or variable pulse rate or at random times. In further examples, at least one detector is coupled to detect radiation produced in response to CPB exposures of the sample and produce corresponding images. For energy dispersive X-ray like applications, the at least one detector is an X-ray detector while in other examples, the detector is a CPB detector. In embodiments, the controller is coupled to produce a tomographic reconstruction corresponding to the sample based on the tomographic images and the plurality of angles and produce estimates of the angles of the plurality of angles during tomographic reconstruction.

Electron beam apparatus comprise a controller situated to be coupled to an electron beam source. At least one computer-readable medium is coupled to the controller and contains controller-executable instructions to cause the controller to direct the electron beam source to stroboscopically irradiate a sample at a plurality of arbitrary angles during a unidirectional rotation of the sample, and acquire a sample image at each of the corresponding plurality of angles. According to some examples, the at least one computer-readable medium further contains controller-executable instructions to reconstruct a tomographic image of the sample based on the sample images and to determine relative rotation angles and/or absolute rotation angles associated with the sample images. In some examples, the relative rotation angles and/or the absolute rotation angles associated with the sample images are determined after acquisition of the sample images or are determined based on a tomographic reconstruction. In additional examples, the at least one computer-readable medium further contains controller-executable instructions for determining relative rotation angles and/or absolute rotation angles with an encoder coupled to a rotatable sample holder. In other representative embodiments, the controller is coupled to direct the electron beam source to stroboscopically irradiate the sample at a plurality of arbitrary angles during the unidirectional rotation of the sample or at a fixed or variable pulse rate based on random time intervals such as Poisson distributed intervals, wherein an angular range of the arbitrary angles includes a plurality of full rotations.

The foregoing and other features of the disclosed technology will become more apparent from the following detailed description, which proceeds with reference to the accompanying figures.

DETAILED DESCRIPTION

Figure 1A:
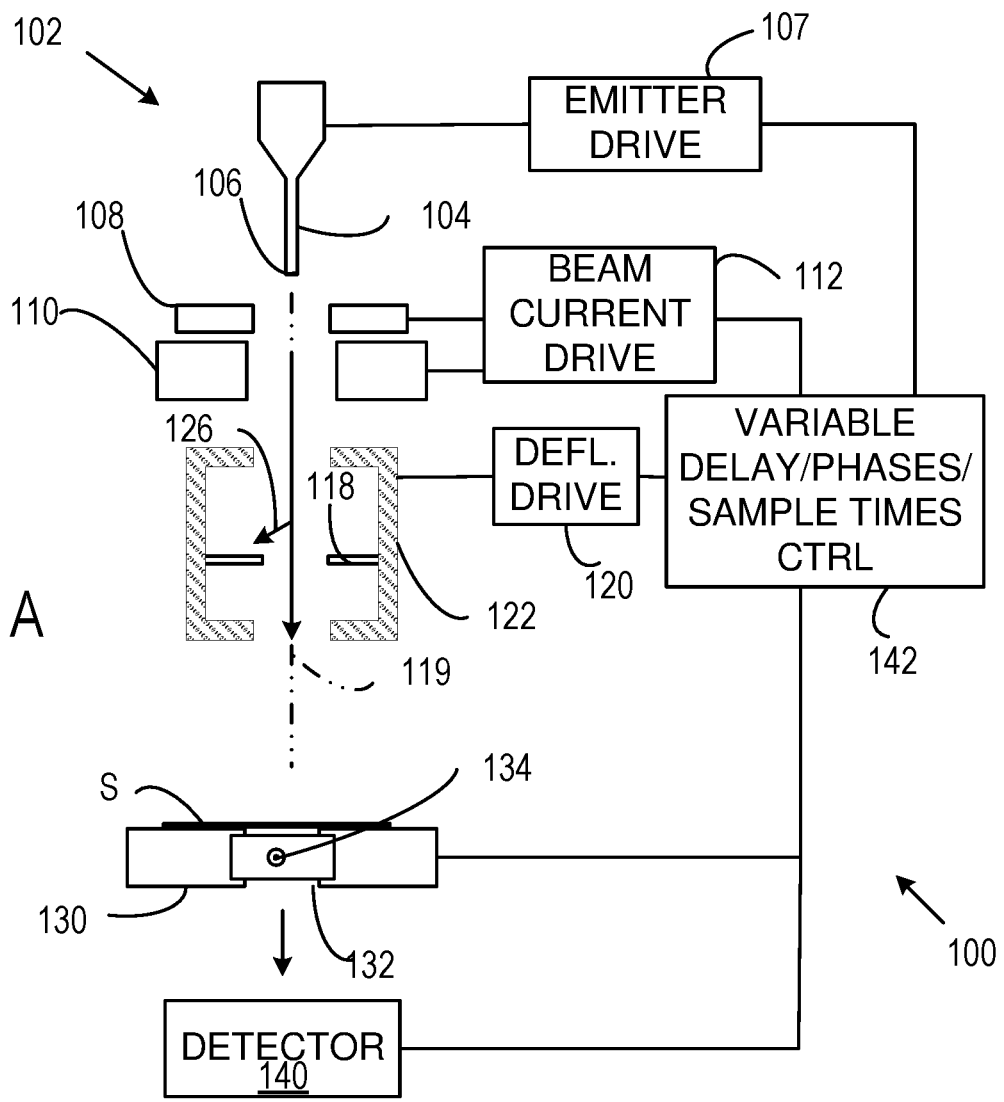
FIG. 1A illustrates a representative CPB microscope that includes a rotatable sample stage.

Disclosed herein are methods and apparatus for charged particle tomography. Typically, a sample is situated on a rotatable sample stage for repetitive exposure to a charged particle beam (CPB). The disclosed examples are generally described with reference to transmission electron microscopy, but other CPBs can be used. Alternatively, samples can be irradiated with X-rays and X-ray based images acquired. In some examples, stroboscopic illumination of a rotating sample at random or other sequences of angles is used to acquire a sequence of images to be used in tomographic reconstruction. A sample can be rotated at a uniform angular velocity, and random angular exposures can be established based on one or more series of angular values which can be generated as needed or retrieved from a computer readable storage such as memory. Angles can be specified based on a phase associated with rotation of a sample, a set of exposure times based on a sample rotation speed, generated randomly during image acquisition, or otherwise specified. The sample can be rotated at a fixed or variable velocity and stroboscopically irradiated while rotating. The stroboscopic irradiation can be at a fixed or variable pulse rate including at random times duration rotation. The irradiation angles can be determined prior to, during, or after irradiation and the irradiation angles can be a fixed or variable distribution of angles, including random angles.

As used herein, "column" refers generally to one or more CPB optical elements or combinations of elements such as CPB sources, CPB lenses, CPB deflectors, CPB apertures, stigmators, or other CPB optical elements. One of such optical elements can be used to produce a pulsed CPB that can be directed to a sample to provide a pulsed exposure. Such pulsed exposures are generally referred to as "stroboscopic" exposures to indicate that effective exposure times are sufficiently short with respect to sample rotation that suitable images are produced, i.e., without undue motion-induced blurring. Suitable exposure times can correspond to rotations of less than 0.0001, 0.001, 0.01 degrees or other angles. Specification of any permitted maximum exposure duration can depend on image magnification and intended resolution. In the disclosed examples, a CPB or a CPB column is energized to produce a stroboscopic CPB exposure, but a continuous CPB can be used with stroboscopic detection, i.e., detection of charged particles or electromagnetic radiation produced in response to CPB exposure and received in a detection time window, referred to herein as "stroboscopic" detection. In stroboscopic exposures, a CPB may have a continuous component in addition to the stroboscopic component. In many practical examples, pulsed exposures are preferred in order to reduce sample degradation produced by CPB exposures that include a continuous component. A continuous component can contribute to undesirable sample changes without improving tomographic imagery.

In some examples, sample images are acquired using exposures at a plurality of angles such as random angles or random angular differences or deterministic angles or deterministic angular differences. As used herein, random or a random selection refers to values that are unevenly spaced and can be selected deterministically or using a random or pseudo random number generator or otherwise approximate randomly selected values. It will be appreciated that any set of such random values can generally be selected with a so-called pseudorandom number generator. One or more sets of random values can be used and different sets can include different values and/or different numbers of values. Values associated with angles, exposure times, or phases can be determined based on a corresponding set of random numbers and the random numbers of the set processed to establish corresponding angles, exposure times, or phases. For example, if a set of N random numbers $R_i$ between 0 and 1 is obtained, angles $\alpha_i$ can be selected as $\pi R_i$ radians, $2\pi R_i$ radians, or, more generally, $A\pi R_i$ radians wherein $A\pi$ radians is a total angular range to be used. The angles $\alpha_i$ can be specified as positive and negative, and exposure at any particular angle $\alpha_i$ can include multiple rotations, i.e., $\alpha_i$ is a rotation angle in radians modulo-$2\pi$ or modulo-$\pi$. Exposure times, relative times, phases, and relative phases can be similarly specified based on a set of random numbers. Values can also be generated on the fly as needed using a random number generator. In some examples, the selected or generated values are used in image reconstruction and each image of a set is associated with a respective random number with particular value.

In some examples, sample exposures are made using a constant sample rotation speed to produce uniformly spaced exposures for convenience, but non-uniform speeds such as monotonically increasing or decreasing speeds, or arbitrary increasing and decreasing rotation speeds can be used. With a uniform, constant rotation, samples can be acquired at random exposure angles with suitable pulse rates or pulse intervals. As discussed above, such random exposures can be based on random exposure times or rotation phases that can be stored or generated as needed. Alternatively, sample rotation can be at a variable speed such as a random speed, and exposure times can be separated by a constant delay.

In some examples, a rotation speed is constant or variable and the stroboscopic exposures can have different pulse distributions, such as random, at fixed or variable pulse rates, or combinations thereof. Pulse intervals can be random, fixed, variable, or combinations thereof so that angular intervals can similarly be constant, variable, random or combinations thereof. Relative and/or absolute exposure angles can be determined after acquisition of some or all images.

Example 1

Referring to FIG. 1A, a CPB system 100 includes a CPB emitter 102 that can include a field emitter 104 or other emission source that produces a CPB from an emitter tip 106. CPB current can be controlled by one or more of a voltage applied to the field emitter 104 or emitter tip 106 as provided by an emitter drive 107. A suppressor electrode 108 is situated about the field emitter 104, typically to suppress stray charged particle emissions, and an extractor electrode 110 is situated to establish a voltage with respect to the emitter tip 106 to induce a selected CPB current. A beam current drive 112 is coupled to the suppressor electrode 108 and the extractor electrode 110. As shown in FIG. 1A, any or all of the suppressor electrode 108, the extractor electrode 110, and the field emitter 104 or emitter tip 106 can be controlled with the emitter drive 107 or the beam current drive 112 to produce a pulsed or other variable CPB so that a sample S can be stroboscopically exposed. One or more additional beam apertures can be situated along a CPB system axis 119 and can be used to control the CPB by, for example, blocking the CPB except at predetermined exposure times. For example, an aperture defined in an aperture plate 118 can be used to block or attenuate a CPB in response to application of a deflection voltage from a deflection driver 120 to a beam deflector 122, such as a resonant beam deflector. With the beam deflector 122 activated, a CPB 126 is deflected to be blocked by the aperture plate 118. Additional apertures and deflectors can be provided, but are not shown in FIG. 1A. The example of FIG. 1A can also provide beam modulation using a gun lens, but such a lens is not shown. In addition to the CPB modulations provided by driving one or more CPB lenses, deflectors, aperture plates or other CPB optical elements, pulsed CPB emissions can be produced in response to irradiation of a suitable target with a pulsed or modulated optical beam or beams. Such CPBs can be further modulated using CPB optical elements as needed.

The sample S is situated on a sample stage 130 that is rotatable about an axis 134 to an desired angle α in response to activation of a motor or other mechanism 132. In some embodiments, all angles of a sample may be available due to the continuous rotation of the sample. While all angles are available, some angles, depending on sample shape, may be avoided due to limited data collection. For example, angles that present a face of a sample that requires the CPB to transmit through a relatively long portion of the sample may be undesirable. Typically, the sample is adjusted through a plurality of angles and corresponding stroboscopic (pulsed) electron beam emissions applied to produce charged particles (e.g., scattered CPB portions, secondary electrons) or electromagnetic radiation (e.g., X-rays) that are received by a detector 140 to produce corresponding images. These images can be subsequently tomographically processed. A controller 142 is coupled to produce stroboscopic CPB emissions and position the sample S at a plurality of angles with respect to the axis 119. The angles can be random angles and can include one or more complete rotations of the sample S about the axis 119. The controller generally controls pulse timing and pulse distributions to obtain images at desired angles.

Figure 1B:
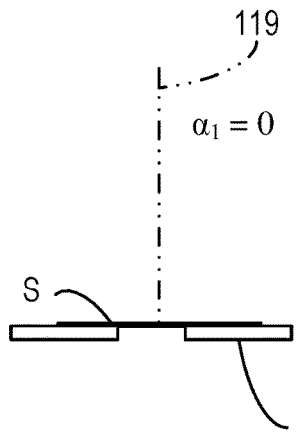
FIGS. 1B-1D illustrate representative sample rotations obtained with the CPB microscope of FIG. 1A.
Figure 1C:
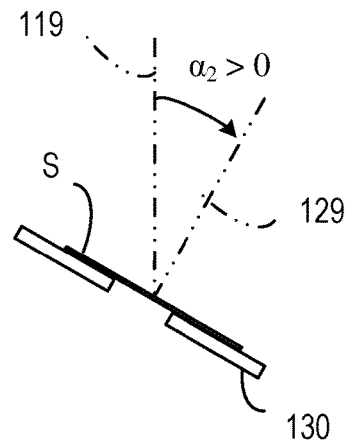
Figure 1D:
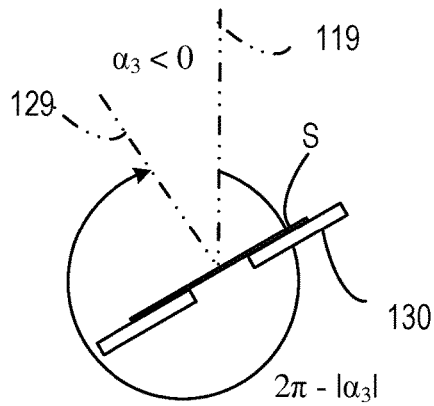

FIGS. 1B-1D illustrate unidirectional rotations of the sample S to provide arbitrary rotations. In these examples, an initial near-normal incidence exposure can be used so that any sample degradation for this exposure can be reduced. For convenience, effective rotation angles α are deemed positive for clockwise rotations of the sample S that are less than π/2; effective rotation angles α are deemed negative for counter-clockwise rotations of the sample S that are less than π/2. For convenience, effective rotation angles are reference to the CPB system axis 119. Arbitrary sample rotations starting at an arbitrary initial rotation angle can be achieved using continuous clockwise or counterclockwise rotations. As shown in FIG. 1B, the sample S is situated so that the CPB system axis 119 and a sample surface normal 129 are substantially parallel, i.e., $α_1=0$. In FIG. 1C, the sample S is rotated clockwise so that the sample S is situated at an angle $α_2>0$ with respect to the CPB system axis 119. In FIG. 1D, the sample S is rotated further clockwise by an angle $2π-|α_3|$ so that the sample S is situated at an angle $α_3<0$ with respect to the CPB system axis 119. Additional rotation angles can be obtained using additional complete rotation revolutions of the sample S, without changing a direction of rotation. A clockwise or counterclockwise rotation can be used to obtain an arbitrary set of sample rotation angles $α_1, \ldots, α_N$ and any particular angle can be used for an initial exposure. These rotation angles can all be provided with a unidirectional rotation, as desired.

Figure 1E:
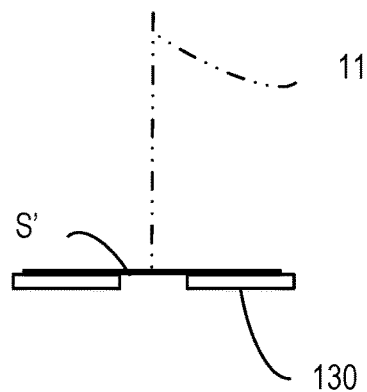
FIG. 1E illustrates a representative needle or pillar shaped sample situated for rotation.

The sample S in FIGS. 1A-1D is shown as a lamella, but other shapes can be used. As shown in FIG. 1E, a sample S' can have a column, pillar, or needle shape and similarly rotated In some examples, images associated with smaller tilt angles are acquired prior to acquisition of images at larger tilts. For example, exposures at a series of small tilts (both clockwise and counterclockwise with respect to a CPB system axis) can be obtained initially, and some exposures may require unidirectional sample rotations of more than 360 degrees or multiple revolutions. Tilt angles α are generally obtained modulo 360 degrees. Exposures at larger tilts can then be made and such exposures may require unidirectional sample rotations of more than 360 degrees.

Example 2

Figure 2:
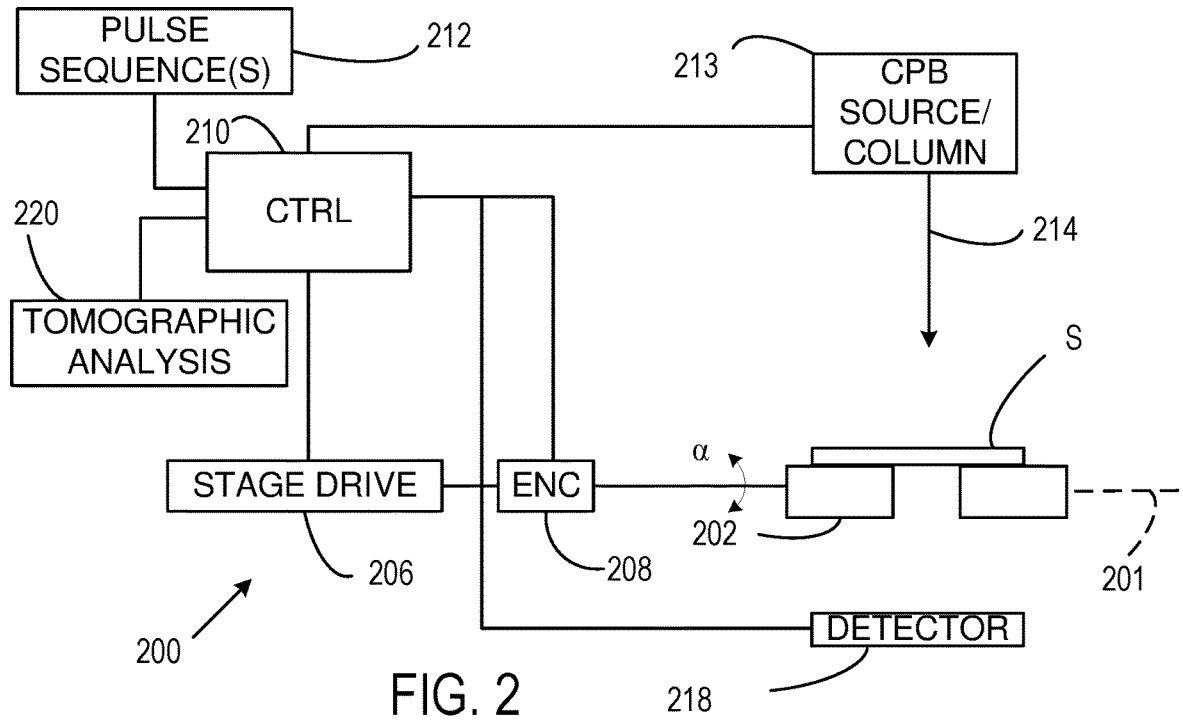
FIG. 2 illustrates another representative system for acquiring random angle CPB images for tomography with a continuously rotatable sample stage.

Referring to FIG. 2, a CPB microscope or other CPB imaging system 200 includes a sample stage 202 that is situated to rotate a sample S about an axis 201. In typical examples, such rotation is continuous and rotation angles can be as great as 180 degrees, 360 degrees, 720 degrees or other values. A stage driver 206 is actuatable to produce such rotations of the sample stage 202. The sample stage 202 and/or the stage driver 206 are coupled to a rotary encoder 208 that permits determination of specimen rotation angles. The stage driver 206 and the rotary encoder 208 are generally coupled to a controller 210 that can initiate or regulate stage rotation. The controller 210 is also coupled to a memory 212 that stores a sequence of values that define respective stroboscopic exposures. Such values can be stored as, for example, a series of exposure times, sample tilt angles, or relative phases or time differences between exposures. In some examples, actual exposure times are calculated based on predetermined rotations of the sample or based on a fixed or variable rotation speed of the sample stage 202.

The controller 210 is coupled to a CPB source and/or column 213 to produce a pulsed CPB 214 based on the stored sequence of values. A detector 218 is situated to receive charged particles or electromagnetic radiation produced in response to a the pulsed CPB 214 such as scattered electrons, secondary electrons, X-rays, or other charged or neutral particles, or other electromagnetic radiation. The detector 218 is coupled to the controller 210 so that images associated with the pulsed exposures can be stored for tomographic processing using computer-executable instructions stored in a memory 220. Alternatively, the controller 210 can communicate the images via a wired or wireless network to an arbitrary location for tomographic processing, reconstruction, and display.

Example 3

Figure 3:
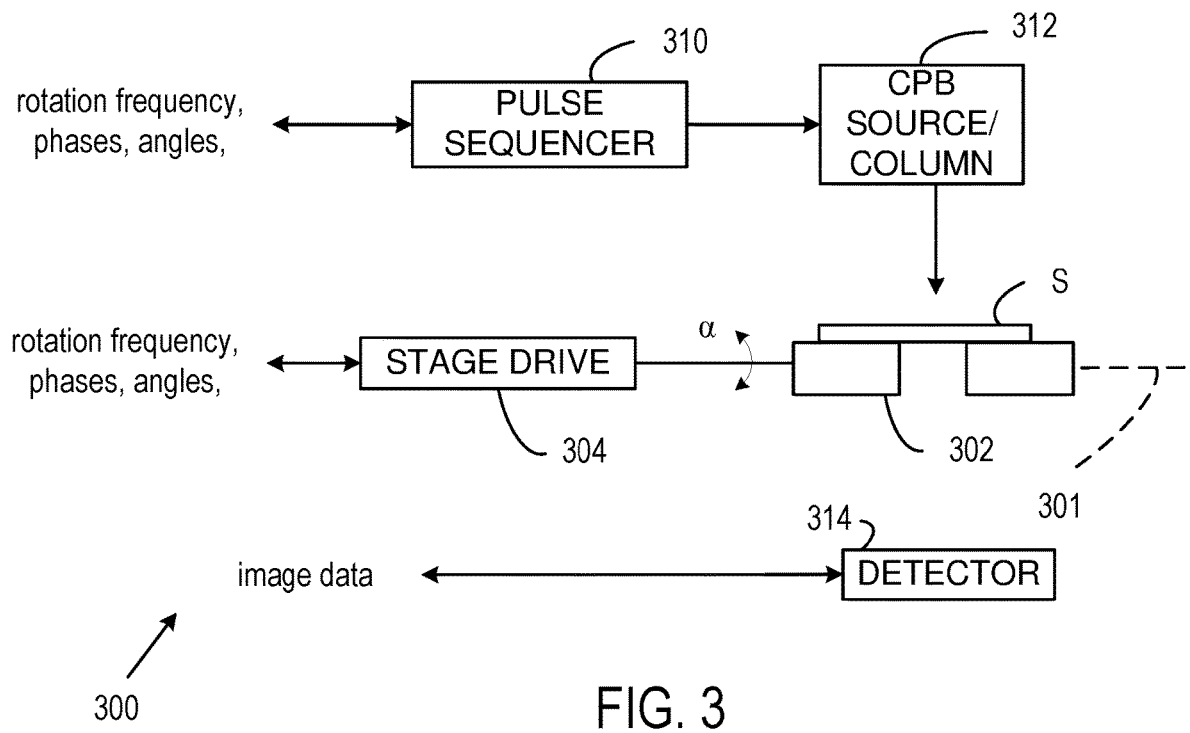
FIG. 3 illustrates a representative system for acquiring random angle CPB images for tomography with a continuously rotatable sample stage.

Referring to FIG. 3, a CPB imaging system 300 includes a sample stage 302 that is configured to receive a sample S. A stage driver 304 is coupled to the sample stage 302 to produce a sample rotation about an axis 301. In most cases, translational motion of the sample S with the sample stage 302 is provided, but translational components are not shown in detail in FIG. 3. The stage driver 304 can produce a sample rotation at a fixed frequency f. This frequency can be set with one or more user or controller inputs to the stage driver 304, but can also be fixed internally. In most cases, initiation of sample rotation is provided by a user input in preparation for image acquisition. As shown, the stage driver 304 can provide an indication of the fixed frequency f at one or more outputs. A pulse sequencer 310 is coupled to a CPB source or column 312 to produce stroboscopic exposure of the sample S at a sequence of sample angles or angular differences. The pulse sequencer 310 can also output data values of other indications of times or relative times of stroboscopic exposures. A detector 314 receives radiation responsive to the stroboscopic exposures and produces corresponding sample images that can be output for remote or local processing to produce tomographic images. As shown in FIG. 3, sample angles are not measured and reconstruction is based on the sequence of angles or angular differences.

Example 4

Figure 4:
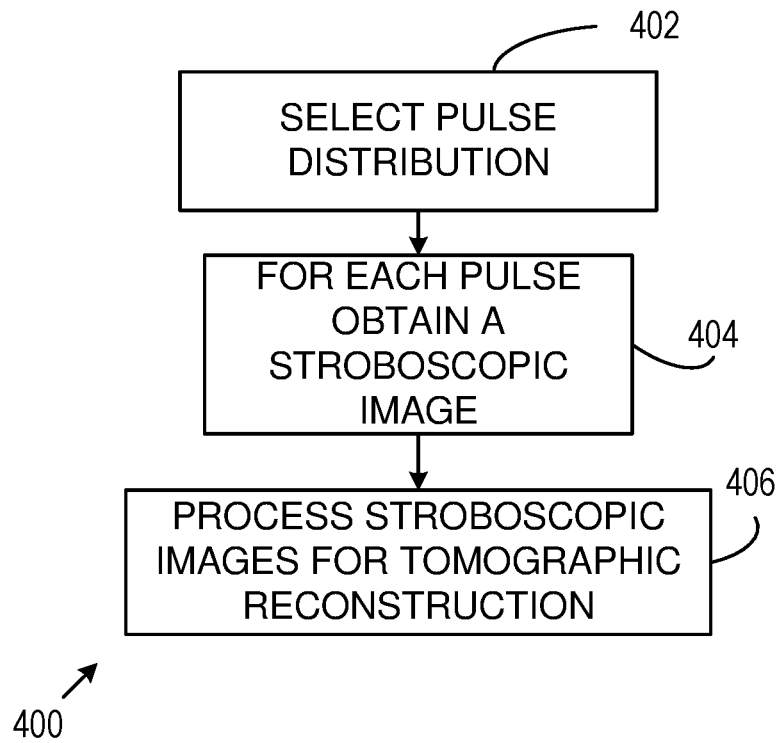
FIG. 4 illustrates a representative method of producing tomographic reconstructions using images acquired with random angle stroboscopic exposures of a rotating sample.

Referring to FIG. 4, a representative method 400 includes selecting a pulse distribution at 402 which can be associated with sample angles $\alpha_1, \ldots, \alpha_N$, wherein N is a positive integer. The pulse distribution can be specified directly as exposure times, exposure rates or combinations of pulse rates, or random times. Exposure times can also directly associated with angles, as relative phases with respect to sample rotation, or otherwise specified as may be convenient. The angles are typically random. At 404, stroboscopic images are acquired for each of the pulses of the pulse distribution with a unidirectional sample rotation. In some cases, the pulse distribution produces sample angles $\alpha_1, \ldots, \alpha_N$ that are specified (in radians) modulo-$2\pi$, modulo-$\pi$ or otherwise, and can be achieved with one or more rotations greater than 90 degrees, 180 degrees, or 360 degrees The stroboscopic images for each of the pulses are then processed to produce a tomographic reconstruction at 406.

Example 5

Figure 5:
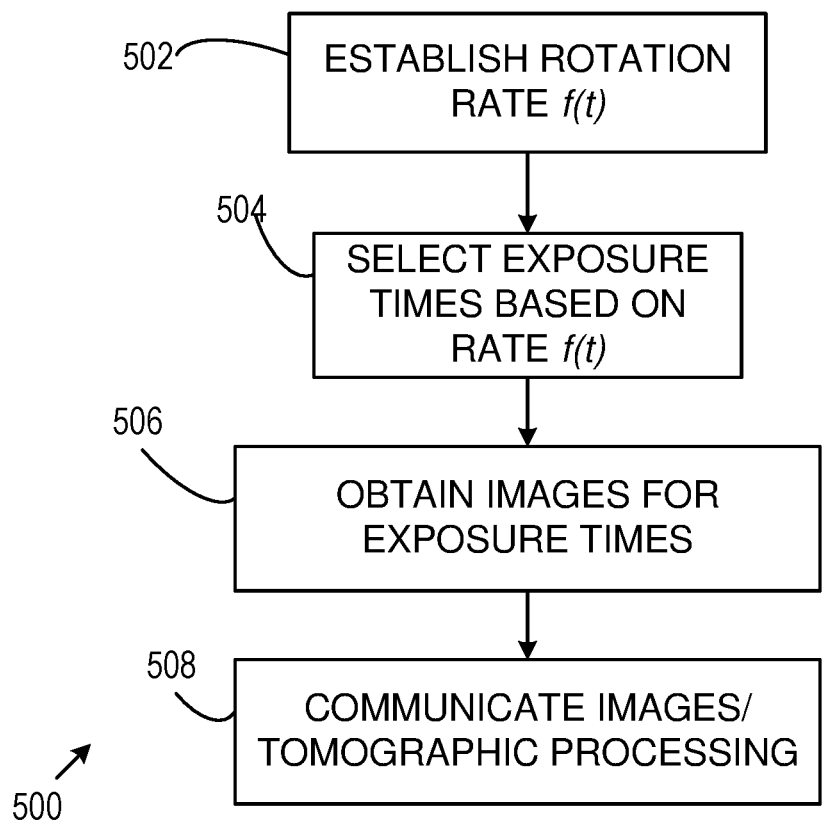
FIG. 5 illustrates a representative method of acquiring sample images based on random exposure times as a function of sample rotation speed.

Referring to FIG. 5, a method 500 includes establishing a sample rotation speed f(t) at 502, typically a constant speed, i.e., f(t)=constant, but arbitrary, variable rotation speeds can be used. Generally, unipolar speeds are preferred (f(t)>0 radian/sec) so that sample rotation is in a single direction during exposures. Unidirectional motion reduces or eliminates rotational artifacts associated with direction changes, and can permit more rapid sample rotations and thus imaging of the sample at successively more rapidly varying (relative) angles. At 504, exposure times/pulse distributions are selected. The exposure times can be established using random numbers that are then scaled to produce the random exposure times. For either a fixed or variable f(t), sample exposure times can be uniformly spaced or be based on a combination of uniform and random spacing, or some other distribution. Random rotations can be used as well, but are not shown in FIG. 5 as it is generally more convenient to maintain a more or less constant rotation speed during exposure. At 506, stroboscopic exposures are used to obtain images for each of the exposure times, and the images can be communicated for tomographic processing or storage at 508. In some cases, the associated exposure angles are not communicated along with the images, but typically each image and an associated angle are communicated.

Example 6

Figure 6:
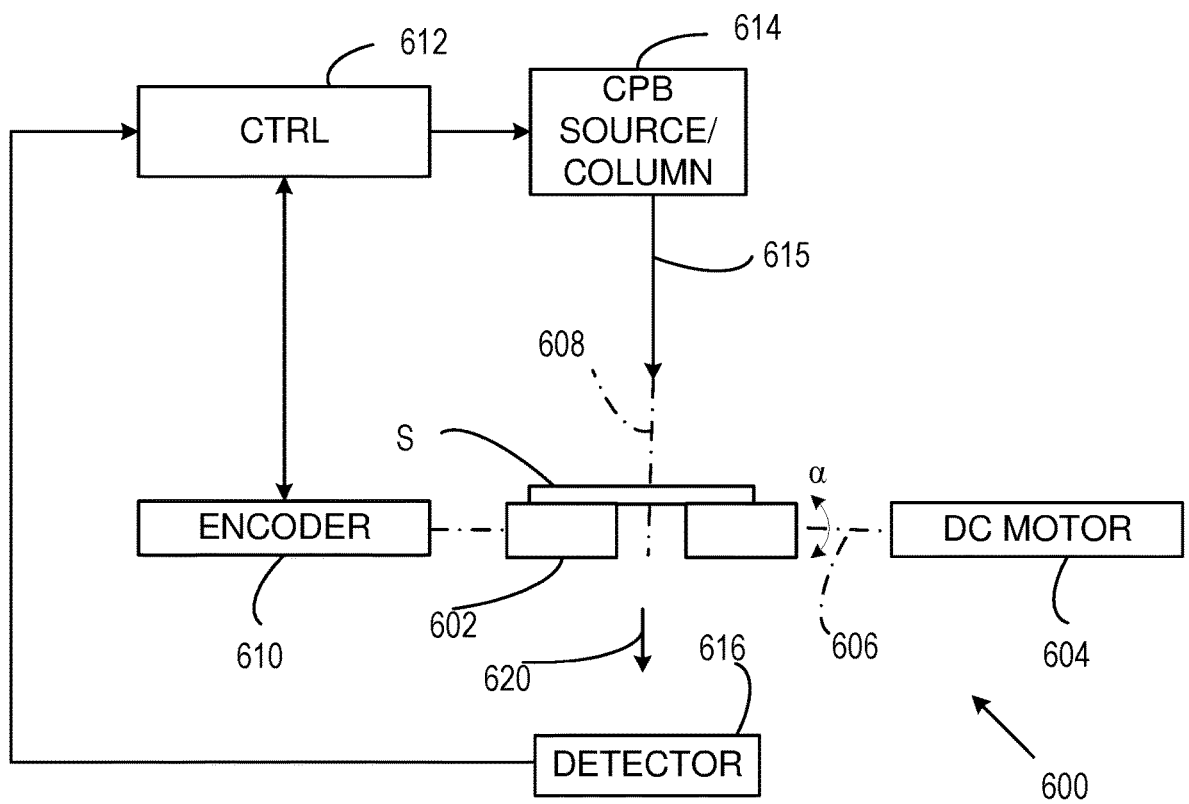
FIG. 6 illustrates a representative system for acquiring CPB images with a sample stage that is rotatable with a DC motor.

With reference to FIG. 6, a CPB imaging system 600 includes a sample stage 602 that is configured to retain a sample S. The sample stage 602 is coupled to a DC motor 604 so that the sample S is rotatable through an arbitrary angle $\alpha$ about an axis 606 that is non-parallel (typically perpendicular) to a CPB exposure axis 608. An encoder 610 provides an indication of rotation angle to a controller 612 that is coupled to a CPB source or CPB column 614 that provides stroboscopic exposures of the sample S to a pulsed CPB 615. A detector 616 is situated to receive electromagnetic radiation or charged particles 620 from the sample S in response to exposure to the pulsed CPB 615. For example, X-rays, secondary electrons, scattered electrons or other scattered, reflected, diffracted charged particles can be produced. The detector 616 is coupled to the controller 612 and provides image data to the controller 612. The controller 612 can be configured to process the received images, direct the received images for remote processing, as well as controlling the CPB source/column 614, the DC motor 604, the sample stage 602 as well as receiving rotation data from the encoder 610.

Example 7

Figure 7:
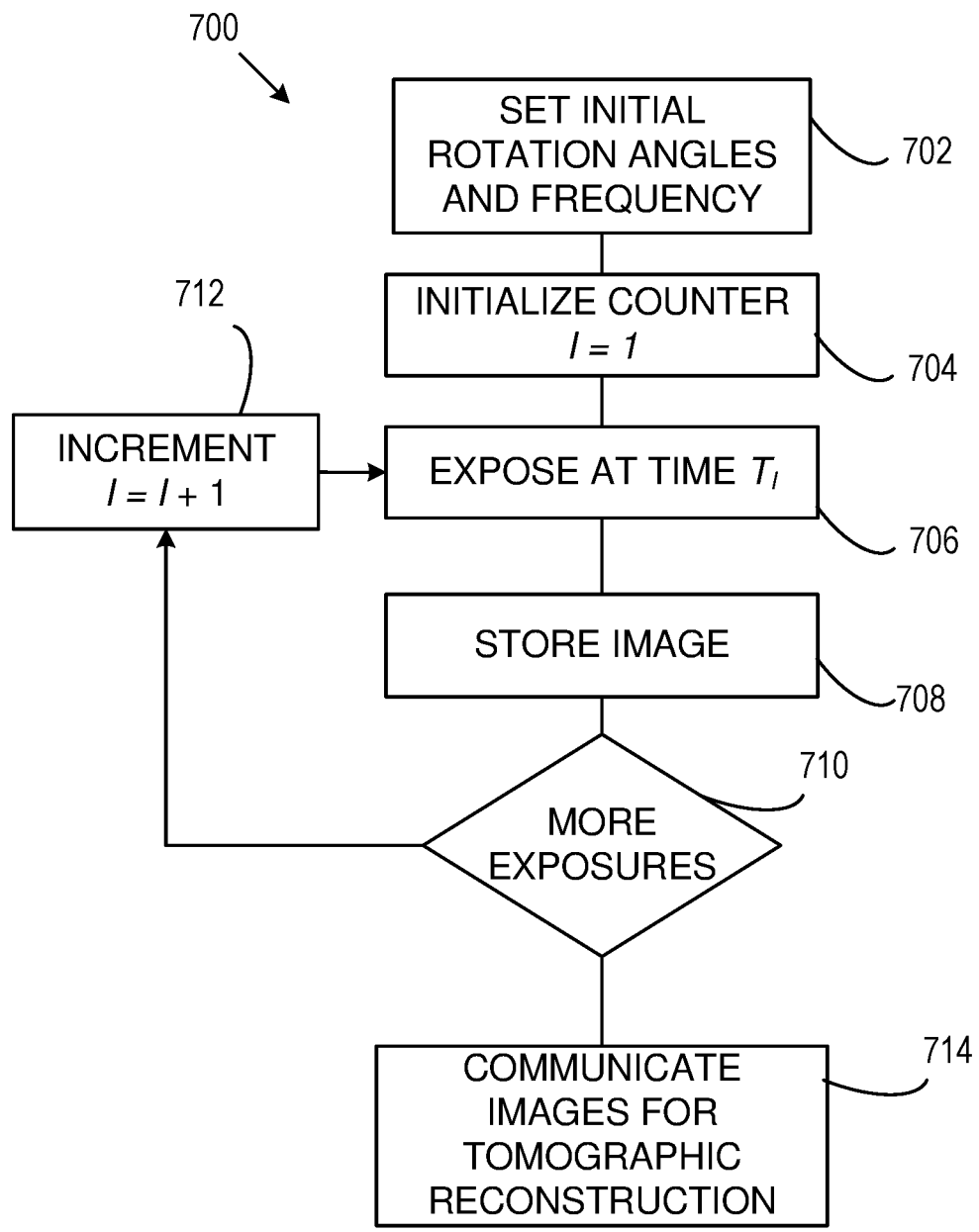
FIG. 7 illustrates another method of acquiring CPB images for tomographic reconstruction.

Referring to FIG. 7, a method 700 of acquiring images for tomographic processing includes establishing initial rotation angles and a rotation frequency at 702. At 704, a counter I is initialized, wherein I is a positive integer, and at 706, a sample is exposed at a time $T_I$. At 708, an image obtained in response to the exposure is stored, and at 710 it is determined if additional exposures are to be obtained. If so, at 712, the counter I is incremented and exposure and image storage are repeated. Upon completion of exposures, at 714, the acquired images are communicated for tomographic reconstruction.

Example 8

Figure 8:
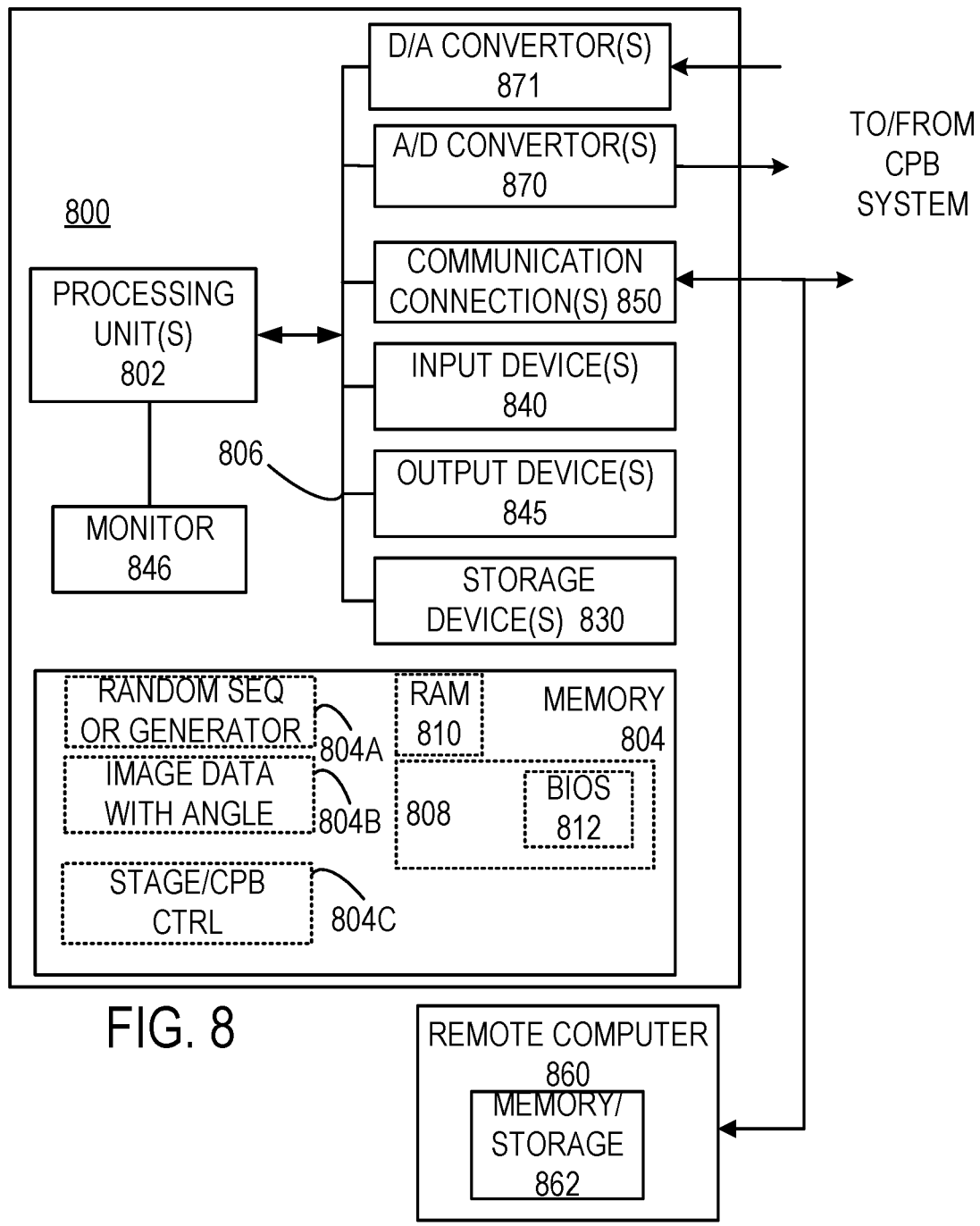
FIG. 8 illustrates a representative computing environment for acquisition and analysis of images for tomographic reconstruction.

FIG. 8 and the following discussion are intended to provide a brief, general description of an exemplary computing environment in which the disclosed technology may be implemented. Although not required, the disclosed technology is described in the general context of computer-executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand-held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 8, an exemplary system for implementing the disclosed technology includes a general purpose computing device in the form of an exemplary conventional PC 800, including one or more processing units 802, a system memory 804, and a system bus 806 that couples various system components including the system memory 804 to the one or more processing units 802. The system bus 806 may be any of several types of bus structures including a memory bus or memory controller, a peripheral bus, and a local bus using any of a variety of bus architectures. The exemplary system memory 804 includes read only memory (ROM) 808 and random access memory (RAM) 810. A basic input/output system (BIOS) 812, containing the basic routines that help with the transfer of information between elements within the PC 800, is stored in ROM 808.

The exemplary PC 800 further includes one or more storage devices 830 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 806 by a hard disk drive interface, a magnetic disk drive interface, and an optical drive interface, respectively. The drives and their associated computer-readable media provide nonvolatile storage of computer-readable instructions, data structures, program modules, and other data for the PC 800. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 830 including an operating system, one or more application programs, other program modules, and program data. A user may enter commands and information into the PC 800 through one or more input devices 840 such as a keyboard and a pointing device such as a mouse. Other input devices may include a digital camera, microphone, joystick, game pad, satellite dish, scanner, or the like. These and other input devices are often connected to the one or more processing units 802 through a serial port interface that is coupled to the system bus 806, but may be connected by other interfaces such as a parallel port, game port, or universal serial bus (USB). A monitor 846 or other type of display device is also connected to the system bus 806 via an interface, such as a video adapter. Other peripheral output devices, such as speakers and printers (not shown), may be included.

The PC 800 may operate in a networked environment using logical connections to one or more remote computers, such as a remote computer 860. In some examples, one or more network or communication connections 850 are included. The remote computer 860 may be another PC, a server, a router, a network PC, or a peer device or other common network node, and typically includes many or all of the elements described above relative to the PC 800, although only a memory storage device 862 has been illustrated in FIG. 8. The personal computer 800 and/or the remote computer 860 can be connected to a logical a local area network (LAN) and a wide area network (WAN). Such networking environments are commonplace in offices, enterprise-wide computer networks, intranets, and the Internet.

When used in a LAN networking environment, the PC 800 is connected to the LAN through a network interface. When used in a WAN networking environment, the PC 800 typically includes a modem or other means for establishing communications over the WAN, such as the Internet. In a networked environment, program modules depicted relative to the personal computer 800, or portions thereof, may be stored in the remote memory storage device or other locations on the LAN or WAN. The network connections shown are exemplary, and other means of establishing a communications link between the computers may be used.

As shown in FIG. 8, the memory 810 includes portions 804A, 806B, 806C that store computer-executable instructions for generating random sequences (or storing one or more such sequences), storing image data, and stage and CPB system control, respectively. Communication with a CBP system or components associated with a CPB system is provided with one or more analog-to-digital convertors (ADCs) 870 or one or more digital-to-analog convertors (DACs) 871.

GENERAL CONSIDERATIONS

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

The term "image" is used herein to refer to displayed image such as on a computer monitor, or digital or analog representations that can be used to produce displayed images. Digital representations can be stored in a variety of formats such as JPEG, TIFF, or other formats. Image signals can be produced using an array detector or a single element detector along with suitable scanning of a sample. In most practical examples, images are 2 dimensional.

Sample stage rotations can be provided with motors and actuators of various kind, including DC motors, stepper motors, rotary piezoelectric motors, AC motors, or other devices. Rotation angles can be detected with optical encoders, magnetic encoders or other devices. Continuous rotation refers to rotations that are allowed to proceed during image acquisition. For example, sequences of drive signals applied to a stepper motor to produce a rotation can continue during image acquisition and a waiting time at a selected imaging angle is not needed. Although a stepper motor is used, the rotation is referred to as continuous. In other examples, a continuous (i.e., non-stepper) motor is allowed to freely rotate the sample. Images can be acquired at random times. In some examples random time intervals are selected based on a Poisson distribution. In this case, a smallest time interval $\Delta t$ and a mean time interval $\overline{N}\Delta t$ are selected and the associated Poisson distribution is defined as:

$$P(n) = \frac{\overline{N}^n}{n!} e^{-\overline{N}},$$

wherein n is an integer number of time intervals and sample time intervals for image acquisition are selected as $n\Delta t$. Such time intervals can be implemented using a suitable random process defined using computer-executable instructions such as random or pseudorandom numbers. Random time intervals $\Delta t$ can also be based on an exponential distribution, wherein $P(\Delta t) = \lambda e^{-\lambda \Delta t}$, wherein $\lambda^{-1}$ is a mean pulse interval. It should be noted that values that characterize some distributions, such as the value $\lambda$, for the exponential distribution are typically referred to as "rate parameters" or "rates" but such values do not correspond to actual pulse rates (e.g., pulses/sec). Similarly, the Poisson distribution is generally characterized with a parameter $\lambda$, that is an average number of events in a particular interval. This rate also does not correspond to an actual pulse rate.

In some cases, an angular range is coarsely sample and then refined. For example, angular steps of 20° are used followed by steps of 5° (skipping previously sampled angles), and then followed by steps of 1° (skipping previously sampled angles). In another example, referred to as "dose symmetric," acquisition starts at a sample tilt of 0°, followed by angles of +° 2, −2°, +4°, −4°, +6°, −6° etc. In still other examples, an angle or angles can be chosen using on-the-fly reconstruction which can detect which angle would contain most useful information.

In view of the many possible embodiments to which the principles of the disclosed invention may be applied, it should be recognized that the illustrated embodiments are only preferred examples and should not be taken as limiting. We therefore claim all that comes within the scope and spirit of the appended claims.

We claim:

1. A method, comprising:
    rotating a sample to each of a first plurality of absolute angles defined by a first inter-angle step size;
    after each rotation, illuminating the sample with a respective electron beam pulse while acquiring, in response to the illuminating, a respective image of the sample;
    rotating the sample to each of a second plurality of absolute angles that are not coincident with an absolute angle of the first plurality, wherein at least one of the second plurality of absolute angles is chosen based on on-the-fly reconstruction; and
    after each rotation to an absolute angle of the second plurality that is not coincident with an absolute angle of the first plurality, illuminating the sample with a respective electron beam pulse while acquiring, in response to the illuminating, a respective image of the sample.

2. The method of claim 1, wherein all rotations are in a same direction.

3. The method of claim 2, wherein at least one of the second plurality of absolute angles is selected based on a second inter-angle step size.

4. The method of claim 3, wherein the first inter-angle step size is an integer multiple of the second inter-angle step size.

5. The method of claim 1, wherein each image is acquired by detecting charged particles or electromagnetic radiation emitted from the sample in response to the respective illuminating.

6. The method of claim 1, further comprising computing a tomographic reconstruction of the sample based on the plurality of images.

7. The method of claim 1, wherein each rotation to an absolute angle is determined by an encoder.

8. A method comprising:
    illuminating a sample with an electron beam pulse while acquiring, in response to the illuminating, an image of the sample, wherein the sample is oriented at an absolute angle equal to zero during the illuminating;
    choosing a rotational angle, $\varphi$;
    setting an integer multiplier, m, to zero;
    repeatedly:
        incrementing the integer multiplier, m,
        rotating the sample to an absolute angle, $\alpha$, where $\alpha = +m\varphi$,
        illuminating the sample with a respective subsequent electron beam pulse while acquiring, in response to the illuminating, a respective image of the sample,
        rotating the sample to an absolute angle, $\beta$, where $\beta = -m\varphi$, and
        illuminating the sample with a respective subsequent electron beam pulse while acquiring, in response to the illuminating, a respective image of the sample;
    and
    rotating the sample to an absolute angle chosen based on on-the fly reconstruction and illuminating the sample with an electron beam pulse while acquiring, in response to the illuminating, an image of the sample at the absolute angle chosen based on on-the fly reconstruction.

9. The method of claim 8, wherein each image is acquired by detecting charged particles or electromagnetic radiation emitted from the sample in response to the respective illuminating.

10. The method of claim 8, further comprising computing a tomographic reconstruction of the sample based on the plurality of images.

11. The method of claim 8, wherein each rotation to an absolute angle is determined by an encoder.

12. An apparatus comprising:
    a rotatable sample holder;
    an electron beam source;
    a detection system operable to acquire images of the sample in response to illumination of the sample by the electron beam source; and
    one or more electronic controllers, computers or processors electrically coupled to the rotatable sample holder, the electron beam source and the detection system, the one or more controllers, computers or processors comprising processor-executable instructions operable to:
        cause the rotatable sample holder to rotate a sample thereon to each of a first plurality of absolute angles that are defined by a first inter-angle step size;

cause, after each rotation, the electron beam source to illuminate the sample with a respective electron beam pulse while simultaneously causing the detection system to acquire, in response to the respective illuminating, a respective image of the sample;

cause the rotatable sample holder to rotate the sample to each of a second plurality of absolute angles that is not coincident with an absolute angle of the first plurality, wherein the second plurality of absolute angles includes at least one absolute angle chosen based on on-the-fly reconstruction; and cause, after each rotation to an absolute angle of the second plurality that is not coincident with an absolute angle of the first plurality, the electron beam source to illuminate the sample with a respective electron beam pulse while simultaneously causing the detection system to acquire, in response to the respective illuminating, a respective image of the sample.

13. An apparatus as recited in claim 12, wherein each image is acquired by detection, by the detection system, of charged particles or electromagnetic radiation emitted from the sample in response to the respective illuminating.

14. An apparatus as recited in claim 12, wherein the one or more electronic controllers, computers or processors is/are further operable to compute a tomographic reconstruction of the sample based on the plurality of images.

15. An apparatus as recited in claim 12, further comprising an encoder coupled to the rotatable sample holder and electrically coupled to the one or more electronic controllers, computers or processors, wherein the one or more electronic controllers, computers or processors are operable to read the encoder.

* * * * *